United States Patent
Guo (10) Patent No.: US 7,710,084 B1
(45) Date of Patent: May 4, 2010

(54) SAMPLE AND HOLD TECHNIQUE FOR GENERATING AN AVERAGE OF SENSED INDUCTOR CURRENT IN VOLTAGE REGULATORS

(75) Inventor: Yigang Guo, Cupertino, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 80 days.

(21) Appl. No.: 12/077,463

(22) Filed: Mar. 19, 2008

(51) Int. Cl.
*G05F 1/613* (2006.01)
*G05F 1/00* (2006.01)

(52) U.S. Cl. .................. 323/224; 323/283; 323/285; 323/288

(58) Field of Classification Search .................. 323/244, 323/283, 285, 288
See application file for complete search history.

(56) References Cited

U.S. PATENT DOCUMENTS

| | | | |
|---|---|---|---|
| 4,243,975 A | 1/1981 | Masuda et al. | |
| 5,852,415 A | 12/1998 | Cotter et al. | |
| 6,215,288 B1 * | 4/2001 | Ramsey et al. | 323/224 |
| 6,226,419 B1 | 5/2001 | Lodwick et al. | |
| 6,320,426 B1 | 11/2001 | Shih | |
| 6,459,335 B1 | 10/2002 | Darmawaskita et al. | |
| 6,515,464 B1 | 2/2003 | Darmawaskita et al. | |
| 6,535,061 B2 | 3/2003 | Darmawaskita et al. | |
| 6,879,136 B1 * | 4/2005 | Erisman et al. | 323/282 |
| 7,045,993 B1 * | 5/2006 | Tomiyoshi | 323/224 |

(Continued)

OTHER PUBLICATIONS

Forghani-Zadeh,H.S, et al. ,"Current-Sensing Techniques for DC-DC Converters", Published 2002, pp. 1-4, IEEE, Georgia Tech Analog Consortium, Georgia Institute of Technology, Atlanta, GA.

(Continued)

*Primary Examiner*—Shawn Riley
(74) *Attorney, Agent, or Firm*—Okamoto & Benedicto LLP (57) ABSTRACT

A sample and hold inductor current sense configuration senses inductor current flowing through an output inductor of a voltage regulator and generates an average of the sensed inductor current. The average of the sensed inductor current may be generated from samples of peaks and valleys of the sensed inductor current. For example, the peak of the sensed inductor current may be stored in a first capacitor and the valley of the sensed inductor current may be stored in a second capacitor. The first and second capacitors may be coupled together to generate the average of the sensed inductor current. The average of the sensed inductor current may be provided to a droop control circuit to control droop of an output voltage of the voltage regulator. An input offset voltage of a current sense amplifier sensing the inductor current may be calibrated between samplings of the sensed inductor current.

20 Claims, 5 Drawing Sheets

U.S. PATENT DOCUMENTS

| | | | |
|---|---|---|---|
| 7,064,528 B2 | 6/2006 | Jochum et al. | |
| 7,064,693 B1 | 6/2006 | Huang et al. | |
| 7,119,522 B1 * | 10/2006 | Tomiyoshi | 323/224 |
| 7,133,751 B2 | 11/2006 | Kurd et al. | |
| 7,135,836 B2 | 11/2006 | Kutkut et al. | |
| 7,157,924 B2 | 1/2007 | Muhtaroglu et al. | |
| 7,158,395 B2 | 1/2007 | Deng et al. | |
| 7,164,275 B2 | 1/2007 | Gasperi | |
| 7,170,765 B2 | 1/2007 | Huang | |
| 7,180,919 B2 | 2/2007 | Kurusu | |
| 7,202,646 B2 | 4/2007 | Vinciarelli | |
| 7,225,349 B2 | 5/2007 | Tam et al. | |
| 7,248,082 B2 | 7/2007 | Nakasha et al. | |
| 7,256,089 B2 | 8/2007 | List et al. | |
| 7,274,181 B2 | 9/2007 | Schrom et al. | |
| 7,279,869 B2 * | 10/2007 | Tzeng et al. | 323/222 |
| RE039,976 E | 1/2008 | Schiff et al. | |
| 7,339,357 B2 | 3/2008 | Lopata | |
| 7,372,238 B1 * | 5/2008 | Tomiyoshi | 323/224 |
| 7,372,241 B1 * | 5/2008 | Tomiyoshi | 323/288 |
| 7,432,689 B2 * | 10/2008 | Miller et al. | 323/259 |
| 7,439,716 B2 * | 10/2008 | Gay | 323/224 |
| 7,492,132 B2 * | 2/2009 | Kuroiwa et al. | 323/222 |

OTHER PUBLICATIONS

"8-Bit Programmable 2 to 4 Phase Synchronous Buck Controller", Apr. 2006, pp. 1-6, FAN5032 Rev 1.0.0, Fairchild Semiconductor Corporation.

"8-Bit Programmable, 2-to 3-Phase Synchronous Buck Controller", Jan. 2007, pp. 1-39, FAN5033 Rev 1.0.0, Fairchild Semiconductor Corporation.

"8-Bit Programmable 2-to 5-Phase Synchronous Buck Controller", Jan. 2007, pp. 1-3, FAN5029 Rev. 1.1.3, Fairchild Semiconductor Corporation.

"6-Bit VID Controller 2-4 Phase VRM 10.X Controller", Jan. 5, 2004, pp. 1-30, FAN5019 Rev. 1.0.7, Fairchild Semiconductor Corporation.

"8-Bit Programmable, 2 to 4 Phase, Synchronous Buck Controller", Mar. 2006, pp. 1-3, FAN5031 Rev. 1.0.1, Fairchild Semiconductor Corporation.

* cited by examiner

SAMPLE AND HOLD TECHNIQUE FOR GENERATING AN AVERAGE OF SENSED INDUCTOR CURRENT IN VOLTAGE REGULATORS

BACKGROUND OF THE INVENTION

1. Field of the Invention

The present invention relates generally to electrical circuits, and more particularly but not exclusively to voltage regulators.

2. Description of the Background Art

A voltage regulator generates a regulated output voltage VOUT from an input voltage VIN. Ideally, the voltage regulator maintains the output voltage VOUT within regulation despite varying load current. However, this is not always the case in real world conditions. The output voltage VOUT of a practical voltage regulator may droop, i.e., decrease linearly, with changing load current. Droop control circuits have been developed to control output voltage droop. However, a droop control circuit must be able to accurately detect load current in order to control droop voltage.

The present disclosure pertains to detecting the average of sensed inductor current, which may be used for droop control and other voltage regulator applications.

SUMMARY

A sample and hold inductor current sense configuration senses inductor current flowing through an output inductor of a voltage regulator and generates an average of the sensed inductor current. The average of the sensed inductor current may be generated from samples of peaks and valleys of the sensed inductor current. For example, the peak of the sensed inductor current may be stored in a first capacitor and the valley of the sensed inductor current may be stored in a second capacitor. The first and second capacitors may be coupled together to generate the average of the sensed inductor current. The average of the sensed inductor current may be provided to a droop control circuit to control droop of an output voltage of the voltage regulator. An input offset voltage of a current sense amplifier sensing the inductor current may be calibrated between samplings of the sensed inductor current.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
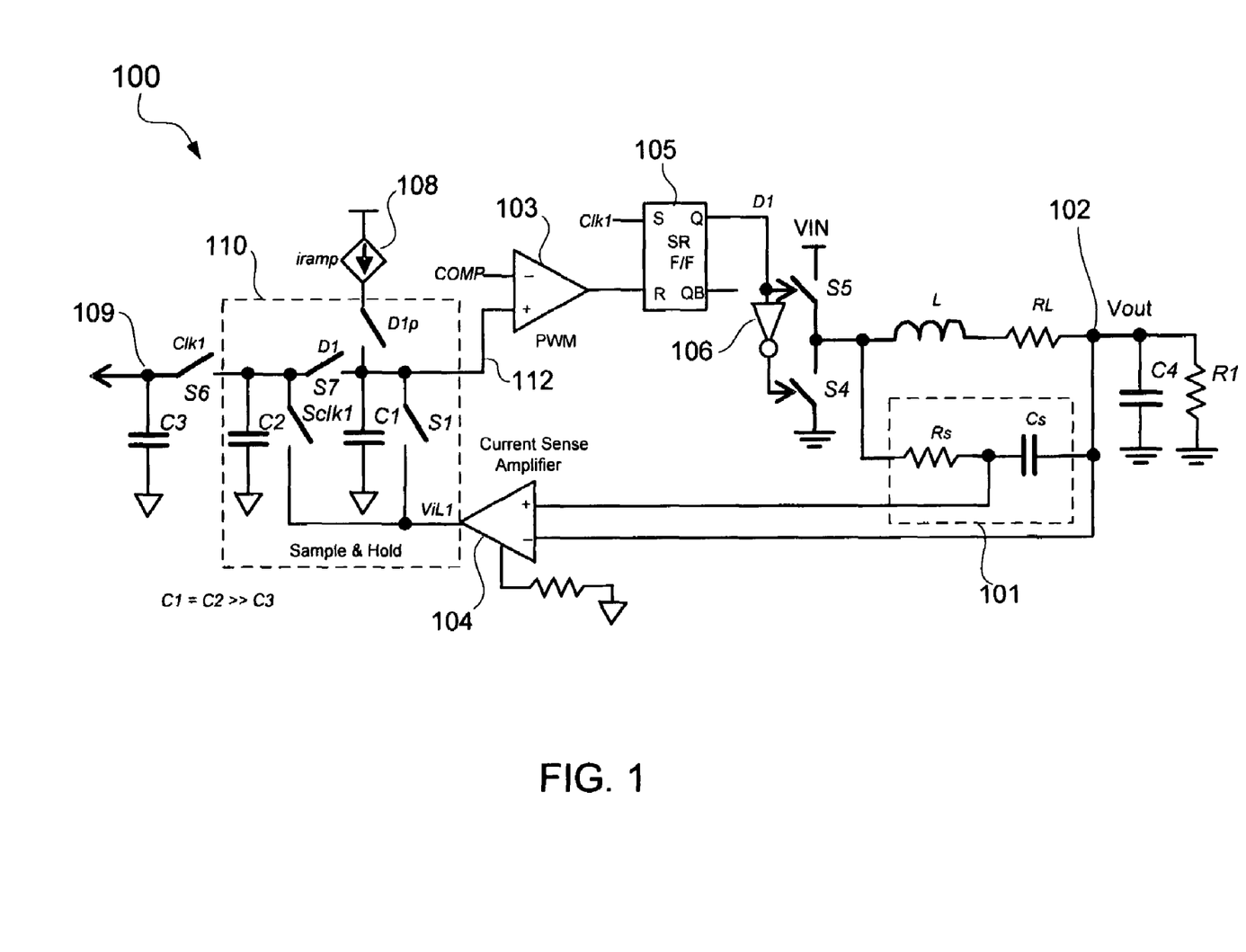
FIG. 1 schematically shows the use of a sample and hold inductor current sense configuration in a voltage regulator in accordance with an embodiment of the present invention.

FIG. 1 schematically shows the use of a sample and hold inductor current sense configuration in a voltage regulator in accordance with an embodiment of the present invention. In the example of FIG. 1, the inductor current sense configuration is employed in a low voltage, high current voltage regulator circuit 100. The regulator circuit 100 may have multiple phases but circuitry for only one phase is shown in FIG. 1 for clarity of illustration. The inductor current sense configuration may also be employed in other voltage regulators without detracting from the merits of the present invention.

In the example of FIG. 1, switches S4 and S5 serve as synchronous switches of the regulator circuit 100. An inverter 106 allows the switch S4 to be ON (i.e., close) when the switch S5 is driven OFF (i.e., open), and to be OFF when the switch S5 is driven ON. The clock signal Clk1 is a periodic signal that sets the SR flip-flop 105 at regular intervals to turn ON the top switch S5. The switches S4 and S5 may comprise MOSFET transistors, for example.

The comparison signal COMP is indicative of the difference between the output voltage VOUT of the regulator circuit 100 at a node 102 and a reference voltage (not shown). The PWM (pulse width modulation) comparator 103 compares the comparison signal COMP to an emulated sensed inductor current at a node 112 to reset the flip-flop 105, and thereby turn OFF the switch S5 and turn ON the switch S4.

The regulator circuit 100 includes an output inductor L and an output capacitor C4. Electrical current through the output inductor L is what is referred to as "inductor current." The load is represented by the resistor R1 and is coupled across the output capacitor C4. The inductor current charges the output capacitor C4 to develop the output voltage VOUT. The resistor RL represents the DCR (DC resistance) of the output inductor L, which is also referred to as the "power inductor." The input voltage VIN is the input voltage to the regulator 100.

In the example of FIG. 1, the sample and hold inductor current sense configuration comprises a lossless current sense circuit 101, a current sense amplifier 104, and a sample and hold circuit 110. The sample and hold inductor current sense configuration allows for sensing of the inductor current and generate its average. The sensed inductor current may be used for droop control, phase current balancing, and pulse width modulation when using current mode control.

The use of a lossless current sense method is preferred for cost and power dissipation considerations. In the example of FIG. 1, the lossless current sense circuit 101 comprises a sense resistor Rs and a sense capacitor Cs, which form an RC network across the output inductor L. The inductor current, i.e., the current through the output inductor L, may be detected by matching the time constant of the sense resistor Rs and sense capacitor Cs with the time constant of the output inductor L and its DCR-RL, $$L/RL = Rs*Cs, \tag{EQ. 1}$$

where RL is the DCR of the output inductor L. The voltage across the sense capacitor Cs is thus equal to the inductor current multiplied by the resistor RL. The current sense amplifier 104 amplifies the voltage across the sense capacitor to generate a sense voltage ViL1 representing the sensed inductor current.

By opening a sample window, the valley, i.e., lowest point, of the inductor current can be detected for cycle-by-cycle based peak/valley current mode control from the output of the current sense amplifier 104. Unfortunately, the resulting sensed inductor valley current is not accurate enough to be used for droop control due to valley-to-average inductor current error. This valley-to-average inductor current error also affects phase current balancing due to mismatched phase inductance. Furthermore, although the voltage across the output capacitor Cs can be directly used for droop programming, it would be relatively difficult to calibrate input offset voltage of the current sense amplifier 104 using this approach because the signal from the output capacitor Cs is continuous. As will be more apparent below, the sample and hold inductor current sense configuration of the present invention addresses these issues.

Figure 2:
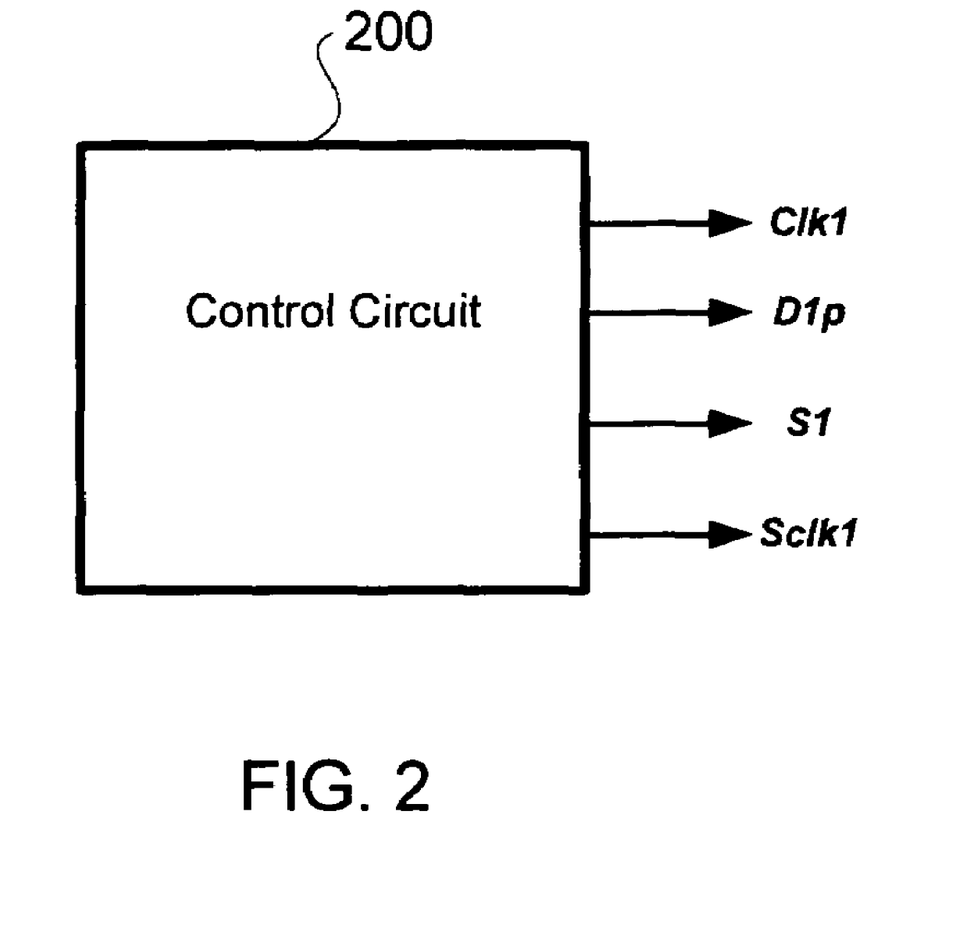
FIG. 2 schematically shows a control circuit in accordance with an embodiment of the present invention.

In the example of FIG. 1, the sample and hold circuit 110 includes capacitors C1 and C2 and switches S1, Sclk1, S7, and D1$p$. A control circuit 200 shown in FIG. 2 may generate the clock signal Clk1 as well as the control signals for the switches S1, Sclk1, and D1$p$ in accordance with the timing diagram shown in FIG. 3. The clock signal Clk1 is provided to the S input of the SR flip-flop 105 and controls a switch S6 at the node 109. The signal D1 from the Q output of the SR flip-flop 105 controls the regulator top switch S5 and the switch S7 in the sample & hold circuit 110. The control circuit 200 may be implemented using a variety of circuits without detracting from the merits of the present invention. The waveforms of FIG. 3 correspond to signals on nodes and components that are labeled the same in FIG. 1. The operation of the sample and hold circuit 110 is now explained with reference to FIGS. 1 and 3.

Figure 3:
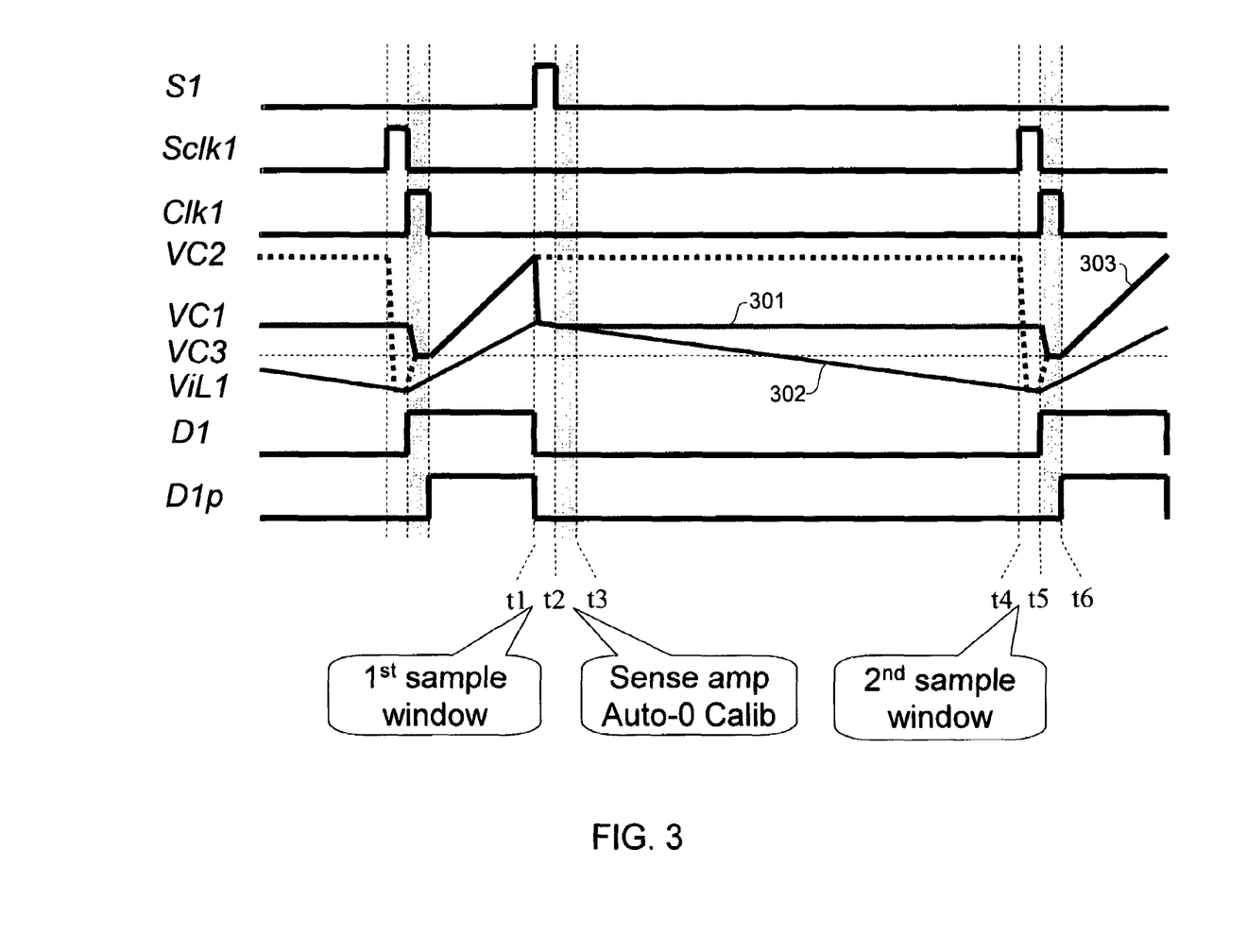
FIG. 3 shows waveforms of signals in the voltage regulator of FIG. 1.

In the example of FIG. 3, the operation of the regulator circuit 100 is divided into time periods t1-t2, t2-t3, t3-t4, t4-t5, and t5-t6. In the period between time t1 and time t2, also referred to as a first sample window, the peak of the sensed inductor current at the output of the current sense amplifier 104 is sampled to the capacitor C1 right after the switch S5 is turned OFF. Turning OFF the switch S5, which is also referred to as the "top transistor," results in the sensed inductor current going down as indicated by the ramping down of the voltage ViL1 during the time period t1-t2. The peak, i.e., highest point, of the sensed inductor current may be sampled into the capacitor C1 by turning ON the switch S1 (see waveform "S1" in FIG. 3), while the switches Sclk1, S7, and D1$p$ are OFF. The voltage across the capacitor C1 is shown in FIG. 3 as the waveform "VC1".

In the time period t2-t3, input offset voltage calibration, such as auto-zero calibration, of the current sense amplifier 104 can be done to further improve phase current sense and droop control accuracy. Any suitable conventional auto-zero calibration scheme for calibrating input offset voltage may be used without detracting from the merits of the present invention. Providing a time period for performing input offset voltage calibration is one of the benefits of using the sample and hold inductor current sense configuration of FIG. 1. In contrast, other methods of sensing the inductor current, such as by using information directly from the sense capacitor Cs, does not readily allow for input offset voltage calibration of a current sense amplifier.

In the time period t3-t4, the switch S4, which is also referred to as the "bottom transistor," continues to be ON (complete S4 ON period is from t1 to t5) and the sensed peak inductor current is held by the capacitor C1 (see 301). The inductor current, which is represented by the voltage ViL1, ramps down towards its valley, i.e., its lowest point, during this time period (see 302).

In the time period t4-t5, also referred to as "second sample window," the valley of inductor valley current is sampled and held at the capacitor C2. The sampling of the valley of the inductor current may be performed at the second sample window defined by the pulse of a periodic clock signal applied at the switch Sclk1 right before the switch S6 or S5 turns ON. Turning ON the switch Sckl1 samples the valley of the inductor current and stores it at the capacitor C2. The voltage across the capacitor C2 is shown in FIG. 3 as the waveform "VC2."

In the time period t5-t6, the clock signal Clk1 turns ON the switch S5 while the switches S7 and S6 are closed. By making the capacitor C1 substantially the same size as the capacitor C2, and the size of each of the capacitors C1 and C2 is made much bigger than the capacitor C3 (e.g., at least 10× bigger), the charges at the capacitors C1 and C2 are shared and the voltage across them is equal to the average of their respective initial voltages. That is, the condition $$C1=C2>>C3 \qquad \text{(EQ. 1)}$$

allows charge sharing between the capacitors C1 and C2, resulting in their voltage to be equal to the average of their voltages before the charge sharing. The voltage across the capacitor C3 tracks the voltage across the capacitors C1 and C2, and is equal to the average of the sensed inductor current. In FIG. 3, the voltage across the capacitor C1 is shown as "VC1", the voltage across the capacitor C2 is shown as "VC2," and the voltage across the capacitor C3 is shown as "VC3." The average sensed inductor current may be provided to a droop control circuit (not shown). Such a droop control circuit may be electrically connected to the regulator 100 at the node 109. As can be appreciated, the average sensed inductor current may also be used for multi-phase current balancing control. Any suitable conventional droop control and multi-phase current balancing control circuits may take advantage of the average sensed inductor current at the node 109 without detracting from the merits of the present invention.

In the example of FIG. 1, a current source 108 generates a ramp current iramp that is proportional to the difference between the input voltage VIN and the output voltage VOUT (i.e., VIN−VOUT) to emulate inductor current rising slope, plus an external compensation ramp slope for current mode control. At the end of the time t6, switch D1$p$ turns ON to allow the current source 108 to charge the capacitors C1 and C2 linearly to emulate sensed inductor current rising slope plus an external compensation slope (see 303). The emulated sensed inductor current is provided as an input to the PWM comparator 103, which together with the clock signal Clk1 at the S input of the flip-flop 105, controls switching of the switches S4 and S5 to maintain the output voltage VOUT within regulation.

Figure 4:
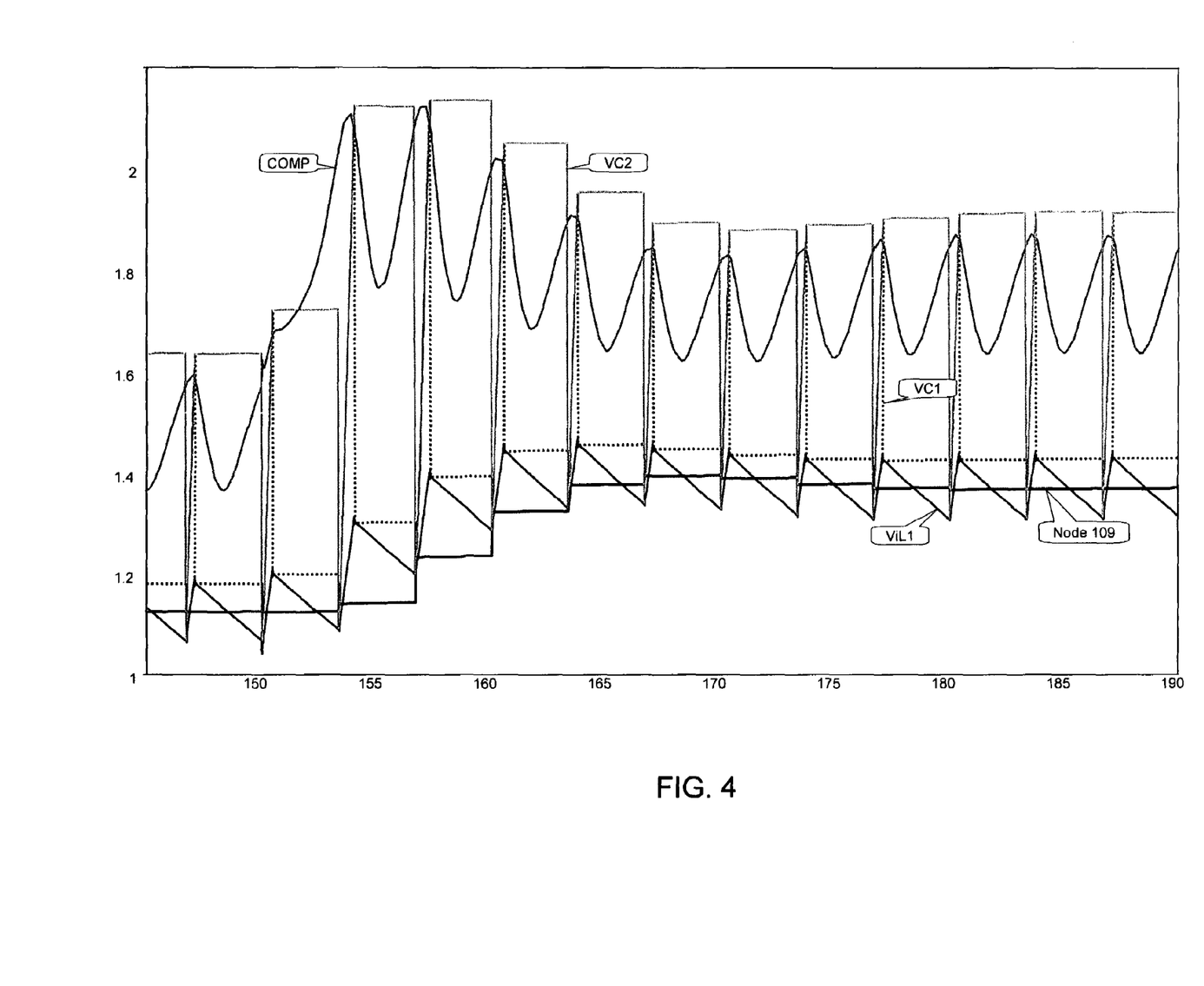
FIG. 4 shows waveforms of signals in the voltage regulator of FIG. 1 in a simulation.

FIG. 4 shows the voltage ViL1 representing the sensed inductor current, the comparison signal COMP, the average sensed inductor current at the node 109, the voltage VC1 across the capacitor C1, and the voltage VC2 across the capacitor C2 in a simulation of the regulator circuit 100 of FIG. 1. In the example of FIG. 4, the horizontal axis represents time in microseconds, while the vertical axis represents magnitude in volts. The fluctuation in the comp signal between 150 and 165 microseconds represents a sudden load increase. During this transition period, the signal at the node 109 does not accurately represent the average of the inductor current. However, the signal at the node 109 quickly adapts to the change in the load and more accurately represents the average inductor current in the steady state period beginning around 170 microseconds.

Figure 5:
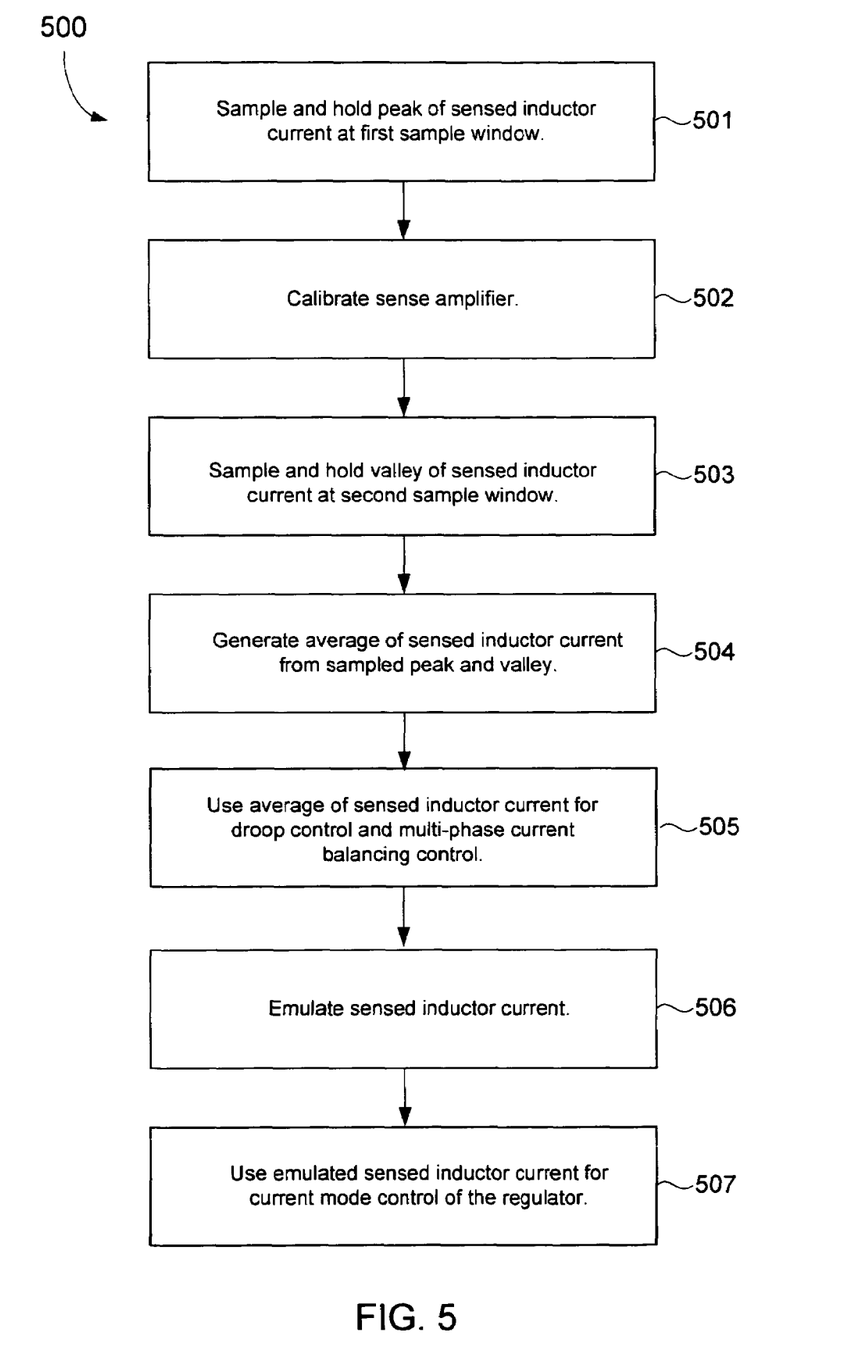
FIG. 5 shows a flow diagram of a method of generating an average of sensed inductor current in a voltage regulator in accordance with an embodiment of the present invention.

Referring now to FIG. 5, there is shown a flow diagram of a method 500 of generating an average of sensed inductor current in a voltage regulator in accordance with an embodiment of the present invention. The method 500 may be performed using components shown in FIG. 1, for example. Other components may also be used without detracting from the merits of the present invention.

In step 501, the sample and hold circuit 110 samples and holds the peak of a sensed inductor current at a first sample window. The sensed inductor current may be indicative of the inductor current flowing through the output inductor L. The inductor current may be sensed from the lossless current sense circuit 101 using the current sense amplifier 104.

In step 502, the input offset voltage of the current sense amplifier 104 is calibrated at a time between the first sample window and a second sample window.

In step 503, the sample and hold circuit 110 samples and holds the valley of the sensed inductor current at the second sample window.

In step 504, an average of the sensed inductor current is generated from the sampled peak and valley of the sensed inductor current. The average sensed inductor current may be generated by coupling together capacitors C1 and C2, which hold the peak and valley samples, respectively, of the sensed inductor current.

In step 505, the average of the sensed inductor current is used for droop control and multi-phase current balancing control of the regulator 100.

In step 506, the sensed inductor current is emulated. An emulated sensed inductor current may be generated by charging the capacitors C1 and C2 with a ramp current that is proportional to the difference between the input voltage VIN and output voltage VOUT of the regulator 100.

In step 507, the emulated sensed inductor current is used for current mode control of the regulator 100.

An effective technique for generating an average of sensed inductor current in a voltage regulator has been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of generating an average of an inductor current in a voltage regulator, the method comprising:
    sampling a peak of a sensed inductor current at a first sample window, the sensed inductor current being indicative of inductor current flowing through an output inductor of a voltage regulator;
    sampling a valley of the sensed inductor current at a second sample window; and
    generating an average of the sensed inductor current based on the sampling of the peak and the valley of the sensed inductor current.

2. The method of claim 1 further comprising:
    calibrating an input offset voltage of a current sense amplifier providing the sensed inductor current between the first sample window and the second sample window.

3. The method of claim 1 further comprising:
    storing the sampled peak of the sensed inductor current in a first capacitor;
    storing the sampled valley of the sensed inductor current in a second capacitor; and
    wherein the average of the sensed inductor current is generated by coupling the first capacitor to the second capacitor to share charges between them.

4. The method of claim 3 further comprising:
    coupling charges from the first and second capacitors to a third capacitor, the voltage across the third capacitor being provided to a droop control circuit to control droop of an output voltage of the voltage regulator.

5. The method of claim 1 further comprising:
    generating an emulated sensed inductor current emulating the sensed inductor current; and
    using the emulated sensed inductor current for current mode control of the voltage regulator.

6. The method of claim 5 wherein the emulated sensed inductor current is generated by feeding a ramp signal to a capacitor where a sample of the sensed inductor current is held.

7. The method of claim 1 wherein the inductor current is sensed by a current sense amplifier from a lossless current sense circuit.

8. A voltage regulator circuit comprising:
    a lossless current sense circuit configured to sense an inductor current flowing through an output inductor of a voltage regulator circuit;
    a current sense amplifier coupled to the lossless current sense circuit to generate a sensed inductor current indicative of the inductor current; and
    a sample and hold circuit configured to sample and hold a peak of the sensed inductor current, to sample and hold a valley of the sensed inductor current, and to generate an average of the sensed inductor current based on the sampled peak and valley of the sensed inductor current.

9. The voltage regulator circuit of claim 8 wherein the sample and hold circuit comprises:
    a first capacitor configured to hold the sampled peak of the sensed inductor current;
    a second capacitor configured to hold the sampled valley of the sensed inductor current;
    wherein the first capacitor and the second capacitor are coupled together to share charges between them and thereby generate the average of the sensed inductor current.

10. The voltage regulator circuit of claim 9 further comprising:
    a third capacitor configured to hold the average of the sensed inductor current.

11. The voltage regulator circuit of claim 10 wherein the third capacitor is configured to be coupled to a droop control circuit configured to use the average of the sensed inductor current to control droop of an output voltage of the voltage regulator.

12. The voltage regulator circuit of claim 8 wherein the sample and hold circuit samples the peak of the sensed inductor current at a first sample window and samples the valley of the sensed inductor current at a second sample window, and wherein an input offset voltage of the current sense amplifier is calibrated between the first sample window and the second sample window.

13. The voltage regulator circuit of claim 8 further comprising: a current source configured to generate a current ramp signal to charge a capacitor of the sample and hold circuit to generate an emulated sensed inductor current.

14. The voltage regulator circuit of claim 13 wherein the regulator circuit uses the emulated sensed inductor current for current mode control of the regulator circuit.

15. A method of generating an average of an inductor current in a voltage regulator, the method comprising:
- storing a sample of a peak of a sensed inductor current in a first capacitor, the sensed inductor current being indicative of inductor current flowing through an output inductor of a voltage regulator;
- storing a sample of a valley of the sensed inductor current in a second capacitor; and
- coupling the first and second capacitors together to generate an average of the sensed inductor current.

16. The method of claim 15 further comprising:
- calibrating an input offset voltage of a current sense amplifier sensing the inductor current between samplings of the peak and the valley of the sensed inductor current.

17. The method of claim 15 further comprising:
- generating an emulated sensed inductor current emulating the sensed inductor current; and
- using the emulated sensed inductor current for current mode control of the voltage regulator.

18. The method of claim 17 wherein the emulated sensed inductor current is generated by feeding a ramp signal to a capacitor where a sample of the sensed inductor current is stored.

19. The method of claim 15 further comprising:
- a third capacitor configured to store the average of the sensed inductor current and provide the average of the sensed inductor current to a droop control circuit configured to control droop of an output voltage of the voltage regulator.

20. The method of claim 15 wherein the inductor current is sensed using a lossless current sense circuit.

* * * * *